United States Patent [19]
Hamilton et al.

[11] Patent Number: 5,901,037
[45] Date of Patent: May 4, 1999

[54] CLOSED LOOP LIQUID COOLING FOR SEMICONDUCTOR RF AMPLIFIER MODULES

[75] Inventors: Robin E. Hamilton, Millersville, Md.; Thomas J. Fagan, Pittsburgh, Pa.; Paul G. Kennedy, Grasonville, Md.; William S. Woodward, Greensburg, Pa.

[73] Assignee: Northrop Grumman Corporation, Los Angeles, Calif.

[21] Appl. No.: 08/877,849

[22] Filed: Jun. 18, 1997

[51] Int. Cl.$^6$ ....................................................... H05K 7/20
[52] U.S. Cl. .................. 361/699; 165/80.4; 165/104.33; 257/714; 174/15.1; 174/252
[58] Field of Search .................................. 165/80.2, 80.4, 165/104.33, 908; 174/15.1, 252; 257/714; 361/689, 698–699

[56] References Cited

U.S. PATENT DOCUMENTS 5,218,515   6/1993   Bernhardt ................................ 361/689

OTHER PUBLICATIONS

"A New Micropump Principle of the Reciprocating Type Using Pyramidic Micro Flowchannels as Passive Valves" J. Micromach, Microang.5 (1995) 199–201. Torsten Gerlach, Matthias Schuenemann and Helmut Wurmus.

*Primary Examiner*—Gregory D. Thompson
*Attorney, Agent, or Firm*—Walter G. Sutcliff

[57] ABSTRACT

A closed loop liquid cooling system for an RF transistor module including a plurality of elongated microchannels connected between a pair of coolant manifolds for conducting liquid coolant beneath one or more transistor dies to dissipate the heat generated thereby, a heat exchanger, a miniature circulating pump located on the module, and passive check valves having tapered passages for controlling the flow of coolant in the loop. The valves are truncated tapered passage microchannel valves having no moving parts and are fabricated so as to be a part of either the circulating pump, the coolant manifolds, or the microchannels.

17 Claims, 5 Drawing Sheets

CLOSED LOOP LIQUID COOLING FOR SEMICONDUCTOR RF AMPLIFIER MODULES

CROSS REFERENCE TO RELATED APPLICATIONS

This application is related to the following copending U.S. patent applications:

U.S. Ser. No. 08/681,345 entitled, "Non-Mechanical Magnetic Pump For Liquid Cooling", Robin E. Hamilton et al, filed on Jul. 22, 1996;

U.S. Ser. No. 08/681,207 entitled, "Microchannel Cooling High Power Semiconductor Devices", Robin E. Hamilton et al, filed on Jul. 22, 1996;

U.S. Ser. No. 08/970,385 entitled, "Closed Loop Liquid Cooling Within RF Modules", Robin E. Hamilton et al, filed on Nov. 4, 1997, and which is a continuation of U.S. Ser. No. 08/681,344, now abandoned.

These applications are assigned to the assignee of the present invention and are meant to be incorporated herein by reference.

BACKGROUND OF THE INVENTION

1. Field of the Invention

The present invention relates to cooling systems for semiconductor devices and more particularly to a closed loop microchannel cooling system for relatively high power transistor RF amplifier modules.

2. Description of Related Art

In high power, solid state RF amplifier modules, the maximum output power that can be produced by the module is limited by the power density of the active devices, typically transistors. The limits imposed by other components neighboring on the power producing devices are insignificant.

The power density of a transistor is limited by the allowable maximum transition junction temperature. In silicon based transistors, for example, junction temperatures exceeding 125° C. result in a significant decrease in transistor life. The bulk of the temperature rise between ambient and the transistor junction is within the RF transistor itself. The temperature rises due largely to numerous conduction losses and the thermal resistance of the bonds between the transistor components. The heat generated in a transistor is typically conducted through the ceramic and metallic case enclosing the active material. The density of the active cells in their placement on the semiconductor is therefore largely dictated by thermal constraints.

As a consequence, state of the art electronic packaging frequently utilizes redundant parts. This results in increased system costs, size and weight. For example, in an air cooled solid state transmitter, used, for example, in the ARSR-4 air traffic control radar system currently being manufactured by the assignee of this invention, the RF power transistors utilized therein are designed to operate below their power output capability, and are spaced inches apart from one another in order to keep them cooled to military standard operating temperatures. The number of transistors and related peripheral circuits required in such solid state transmitters is dictated by transistor packaging and conventional heat sinks. Accordingly, higher power RF transistors are being developed and used in such systems to enhance their capabilities and increasing reliability, while at the same time reducing size and costs.

It has been demonstrated that by eliminating the thermal interfaces and extracting the heat directly from the active material, the power density of the transistor can be increased by a factor of 2 or more. Doubling the output power of each transistor halves the number of transistors and circuits required and therefore significantly reduces the cost, size and weight of the transmitter.

This has been accomplished, for example in the above cross referenced related applications, U.S. Ser. No. 08/681, 207, entitled "Microchannel Cooling Of High Power Semiconductor Devices", and U.S. Ser. No. 08/970,385, entitled "Closed Loop Liquid Cooling Within RF Modules". There cooling is accomplished by forming small coolant passages, called microchannels, in the base of the active material, and passing the coolant into and out of the transistor case through small passages. A pump is used to circulate cooling liquid through the microchannels. Suction and discharge valves are also associated with the pump and typically are located at the pump or in the coolant lines.

SUMMARY

Accordingly, it is an object of the present invention to provide an improvement in the liquid cooling of heat generating semiconductor devices.

It is another object of the invention to provide an improvement in the circulation of liquid through relatively small coolant passages associated with solid state devices.

It is a further object of the invention to provide a passive valve for use in a coolant circulating system for high power semiconductor devices.

It is still another object of the invention to provide a valve having no moving parts for controlling the flow of coolant in a closed loop microchannel cooling system for high power RF amplifier modules.

Briefly, the foregoing and other objects are achieved by a closed loop liquid cooling system for an RF transistor module and comprising the combination of a plurality of elongated microchannels connected between a pair of coolant manifolds for conducting liquid coolant beneath the transistors to dissipate the heat generated thereby, a heat exchanger, a miniature circulating pump located on the module, and passive check valves having tapered passages for controlling the flow of coolant in the loop. The valve comprises a truncated pyramidic microchannel valve having no moving parts and is fabricated so as to be a part of either the circulating pump assembly, the coolant manifold, or the microchannels.

Further scope of applicability of the present invention will become apparent from the detailed description provided hereinafter. However, it should be understood that the detailed description and specific examples, while depicting preferred embodiments of the invention, are given by way of illustration only, since changes and modifications coming within the spirit and scope of the invention will become apparent to those skilled in the art from this detailed description.

BRIEF DESCRIPTION OF THE DRAWINGS

The present invention will become more fully understood from the detailed description provided hereinafter and the accompanying drawings which are given by way of illustration only, and thus are not meant to be limitative of the invention, and wherein.

DETAILED DESCRIPTION OF THE INVENTION

Figure 1:
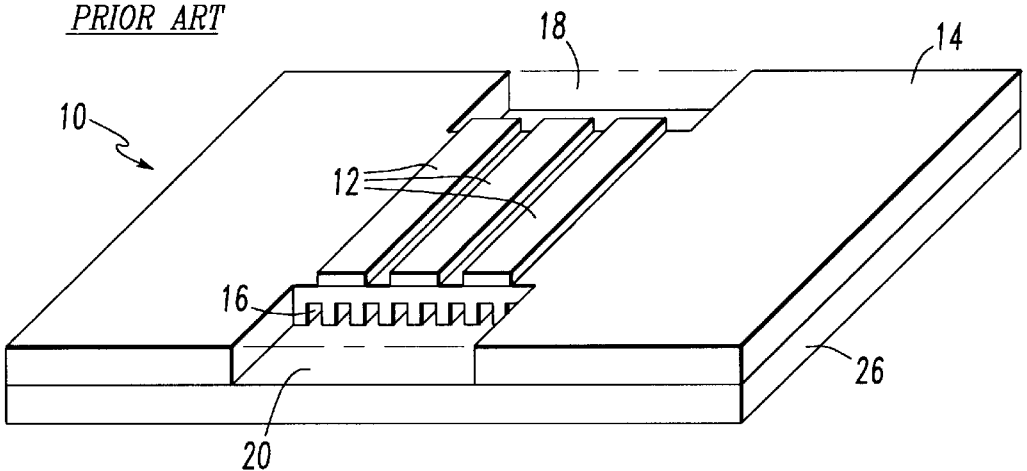
FIG. 1 is a perspective view broadly illustrative of a microchannel cooled module including multiple heat generating semiconductor devices in accordance with the known prior art.
Figure 2:
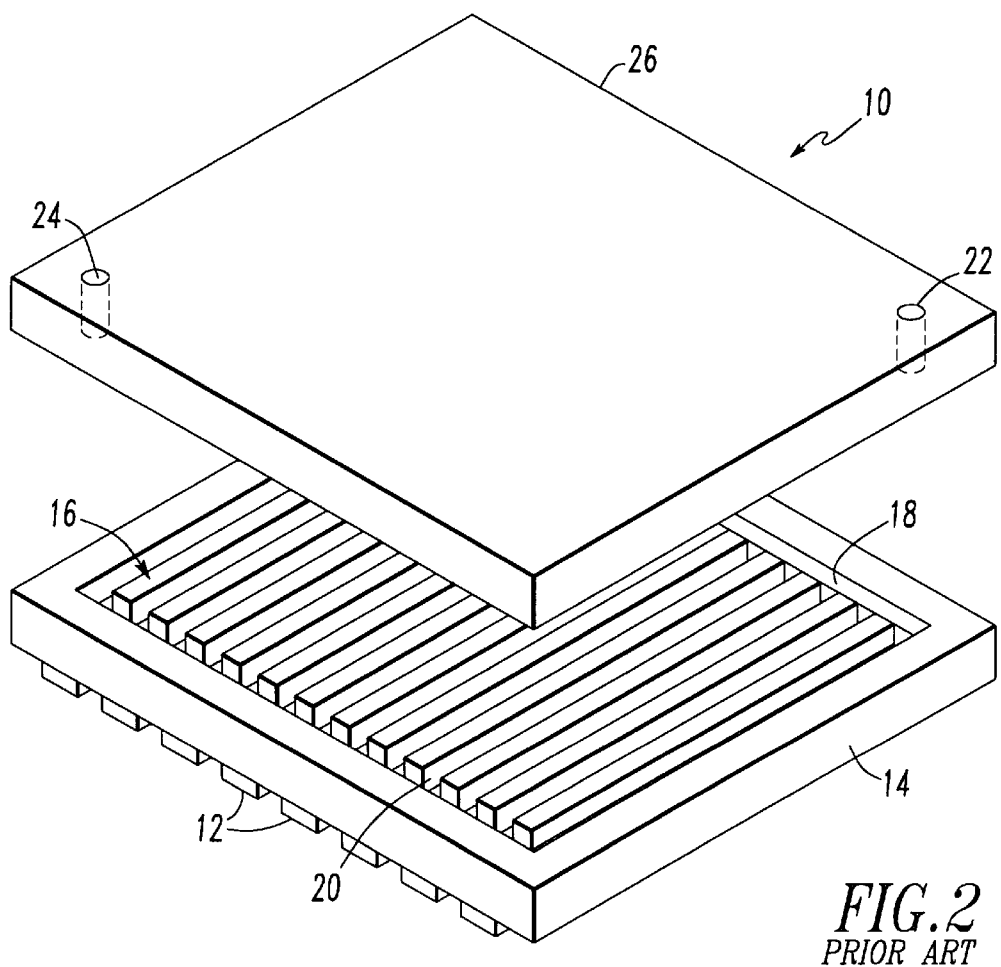
FIG. 2 is an exploded perspective view further illustrative of the underside of the module shown in FIG. 1.

Referring now to the drawings and more particularly to FIGS. 1 and 2, shown thereat is a microchannel cooled high power RF transistor amplifier module 10 comprised of a plurality of transistor dies 12, each including multiple transistors, not shown, connected in parallel. The dies 12 are mounted on a substrate 14 which may be, for example, silicon or other semiconductor material. As taught in the above cross-referenced application Ser. No. 08/970,385 and Ser. No. 08/681,207, the substrate 14 includes a plurality of parallel microchannel grooves 16, referred to as microchannels, and are adapted to conduct fluid coolant therethrough for dissipating heat generated by the transistors in dies 12. Because of their relatively small size, the microchannels 16 operate to increase heat transfer, inasmuch as they act as fins, providing a high surface area.

The microchannels 16 terminate in input and output coolant manifolds 18 and 20 as shown in FIG. 2, and are connected in a closed coolant circulating loop to a source of coolant, not shown, via coolant inlet and outlet ports 22 and 24 formed in the channel closure member 26 and which may be, for example, a flat piece of semiconductor material.

Because water provides high convection coefficients and high specific heats, it becomes a desirable coolant; however, it is subject to freezing. Accordingly, a mixture of ethylene-glycol and water is usually preferred.

Figure 3:
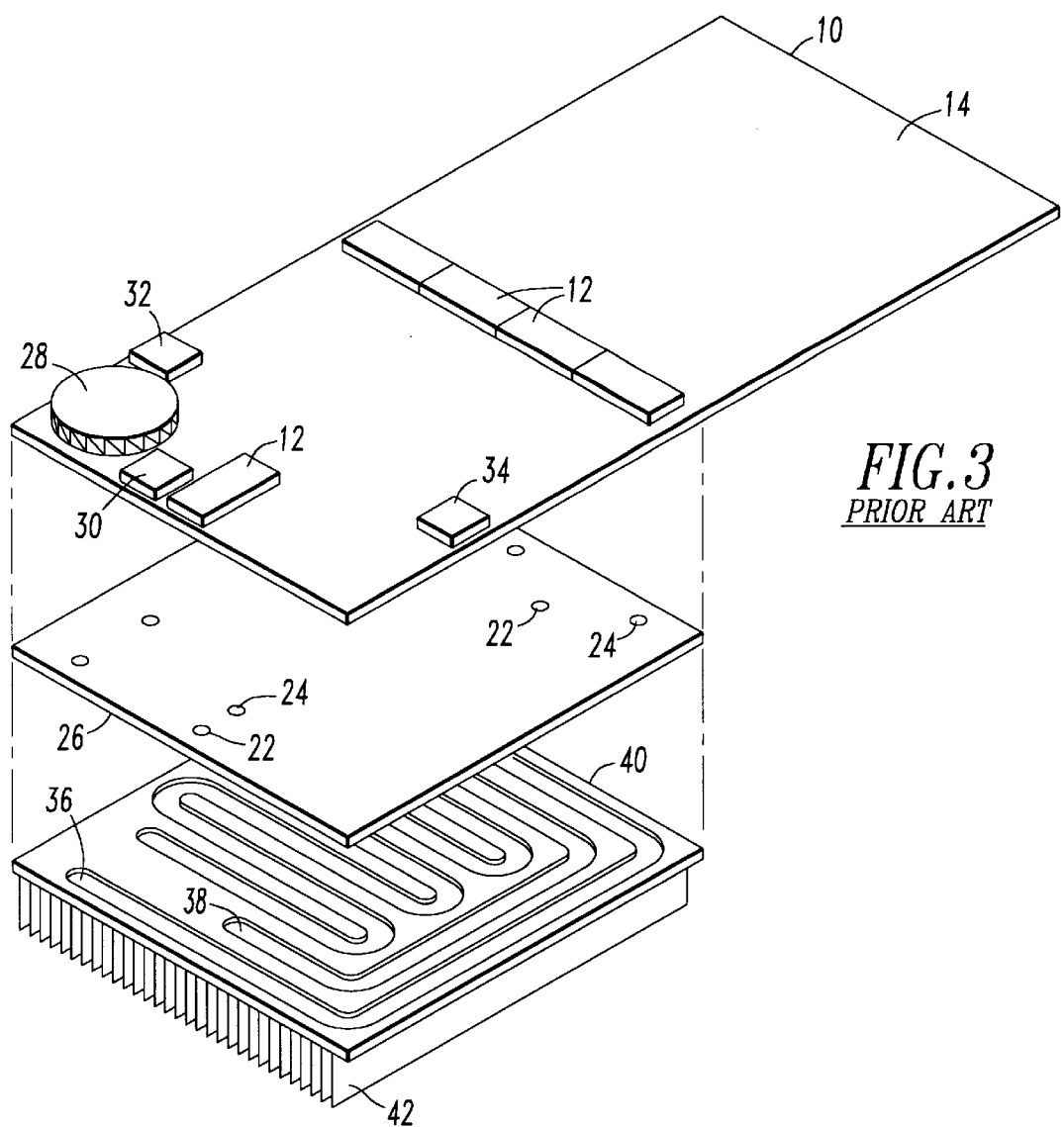
FIG. 3 is an exploded perspective view generally illustrative of a known prior art closed loop liquid cooling system for a high power transistor module.
Figure 4:
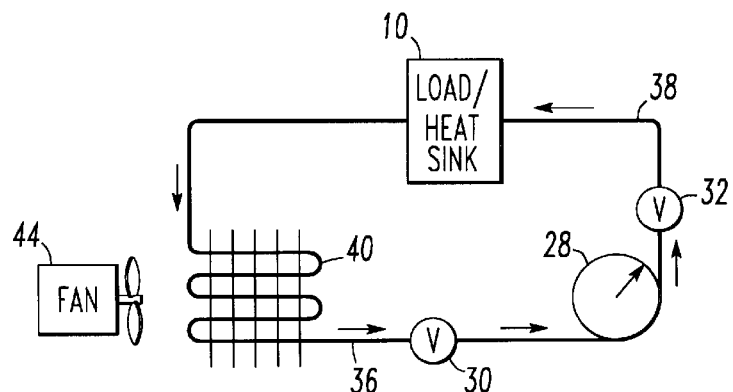
FIG. 4 is a mechanical schematic diagram illustrative of a closed loop liquid cooling system shown in FIG. 3 in accordance with known prior art.

Referring now to FIG. 3, shown thereat is a closed loop liquid cooling system for an RF amplifier module 10 according to the known related art. As shown, a plurality of transistor dies 12 are located on a common dielectric substrate 14 along with a miniature coolant pump 28 and input and output check valves 30 and 32. Beneath the substrate 14 is a channel closure member which may be, for example, the flat plate 26 as shown in FIG. 2. Reference numeral 34 denotes a coolant fill port and vent. Further as shown in FIG. 3, coolant is circulated via a pair of fluid routing channels 36 and 38 formed in the top portion of a liquid to air heat exchanger structure 40 which includes a fin stock assembly 42 that is air cooled by a fan 44 (FIG. 4). FIG. 4 further discloses a closed loop microchannel cooling system according to the known related art including, among other things, a load/heat sink which in effect comprises the transistor dies 12, liquid recirculating pump 28 therefor, and the heat exchanger 40. The input and output check valves 30 and 32 comprise discrete active devices which are located in close proximity to the pump 28 or in the coolant lines 36 and 38 leading to and from the pump 28.

With respect to the coolant recirculating pump 28, one design which can be utilized in connection with this invention is disclosed in the above referenced related application Ser. No. 08/681,345 entitled, "Non-Mechanical Magnetic Pump For Liquid Cooling" and comprises a pump assembly which can pump coolant through microchannels without the need for moving parts in the valve. Another pump 28 which can be utilized comprises a miniature pump having an electrically driven diaphragm such as a piezoelectric wafer, which when energized, produces a pumping action. Such a device is disclosed in a publication entitled, "New Micropump Principle of the Reciprocating Type Using Micro Flowchannels As Passive Valves", T. Gerlach et al, *Journal of Micromachines and Engineering*, June, 1995, pp. 199–201.

Figure 5:
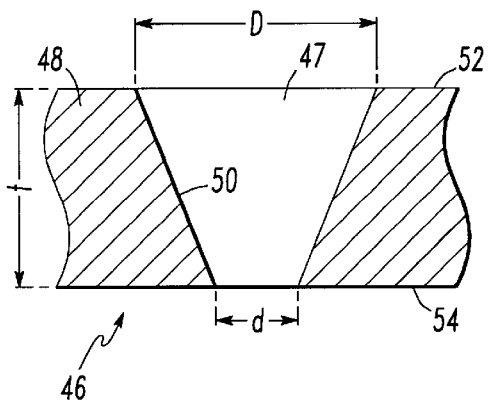
FIG. 5 is a central cross sectional view illustrative of a known prior art passive type pyramidic microchannel valve.
Figure 6:
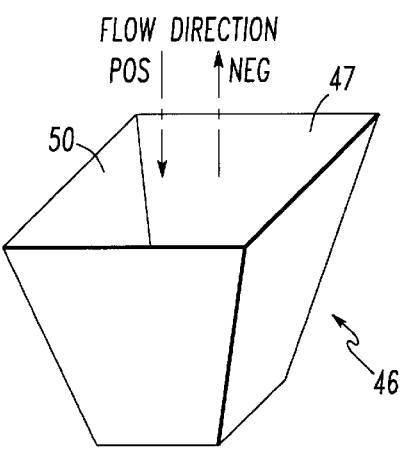
FIG. 6 is a perspective view of the valve shown in FIG. 5.
Figure 8:
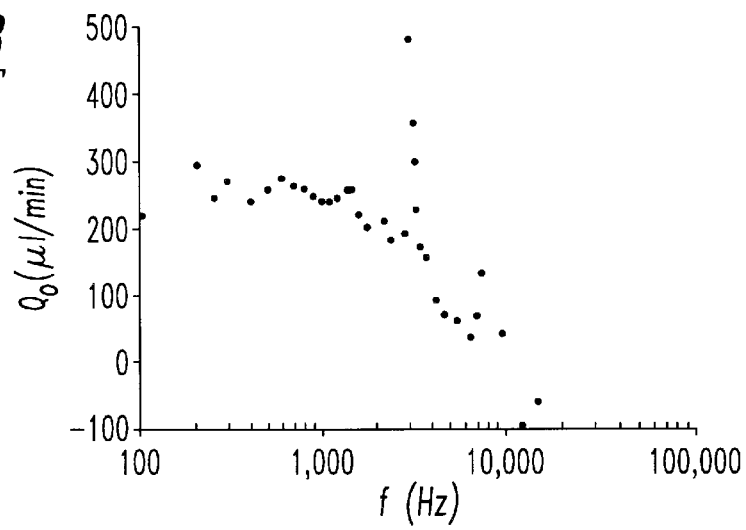
Figure 9:
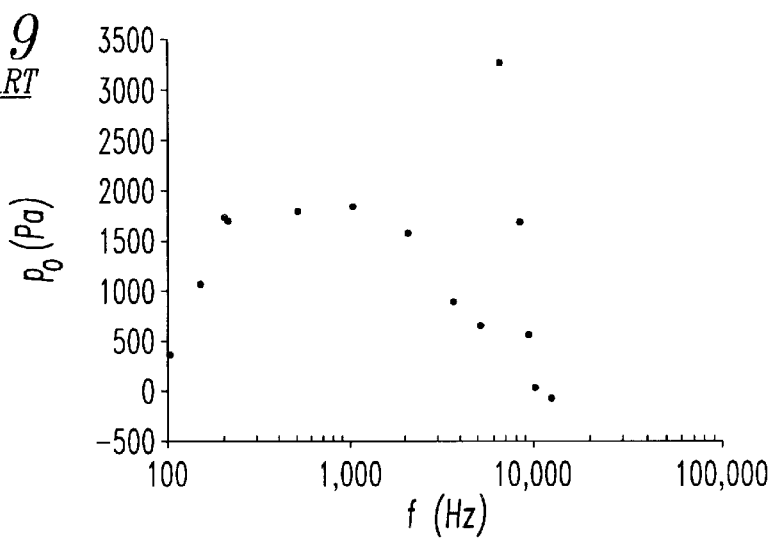

The Gerlach et al publication also discloses the details of a passive valve 46 in the form of a truncated pyramid as shown in FIGS. 5 and 6. The valve 46 is formed in a layer 48 of semiconductor material, such as silicon, and having a thickness t. The pyramidic valve 46 includes four flat faces 50, which slope at an angle $\alpha=54°.74°$ with respect to the upper and lower faces 52 and 54 of the semiconductor body 48. Such a configuration results in a relatively wide opening D for coolant fluid in a positive flow direction and a relatively smaller opening d for fluid flow in a negative direction. Gerlach et al also discloses valve 46 being integrated into the pump assembly. The characteristics of such a structure are shown in FIGS. 7, 8 and 9.

Figure 7:
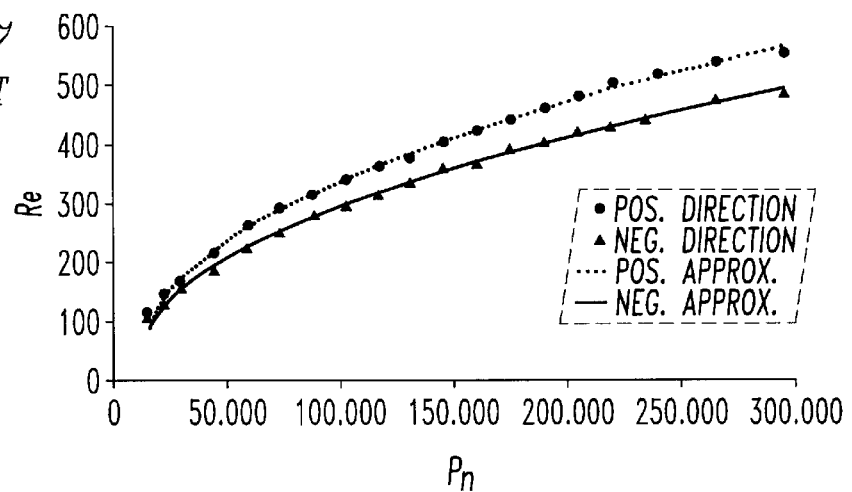
FIGS. 7, 8 and 9 are curves illustrative of the operating characteristics of the valve shown in FIGS. 5 and 6.

FIG. 7 depicts a graph of the Reynolds number as a function of normalized pressure for a truncated pyramid shaped microchannel formed on a relatively thin layer of silicon and is indicative of the fact that the Reynolds number in the positive flow direction is greater than that in the negative flow direction and thus is indicative of the fact that a valve having no moving parts can be implemented by such a design. FIG. 8 is a curve indicative of a micropump including a passive pyramidic microchannel valve and which can operate up to 10 KHz. This is further buttressed by the pressure vs. frequency curve of FIG. 9.

Figure 10:
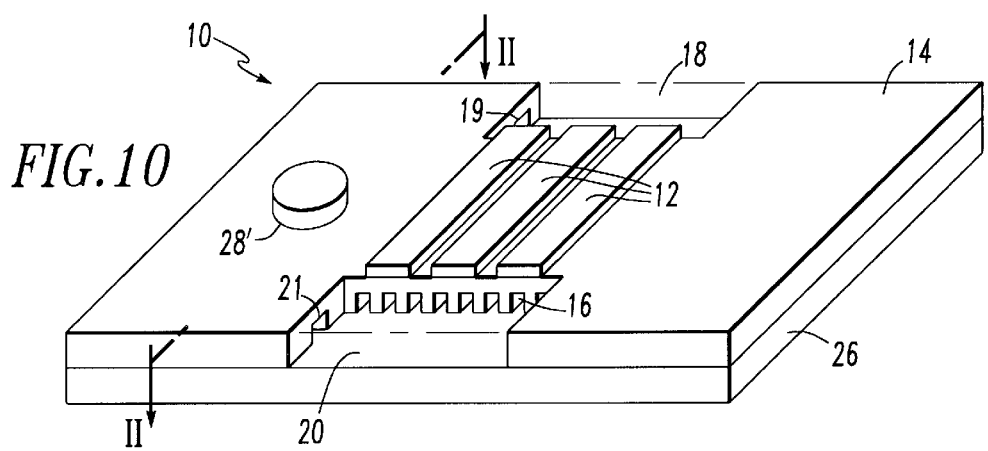
FIG. 10 is a partial cut-away view of the embodiment of a closed loop microchannel cooling system utilizing tapered passage microchannel valves shown in FIG. 5 which are part of a coolant circulating pump of a microchannel cooled transistor module.

The present invention is directed to the concept of passive valves 46 having tapered passages 47 (FIG. 5) being built into the transistor structure of microchannel cooled high powered RF amplifier modules such as shown in FIGS. 1 and 2 or in the body of the pump supplying coolant to a microchannel arrangement as shown in FIG. 10.

Figure 11:
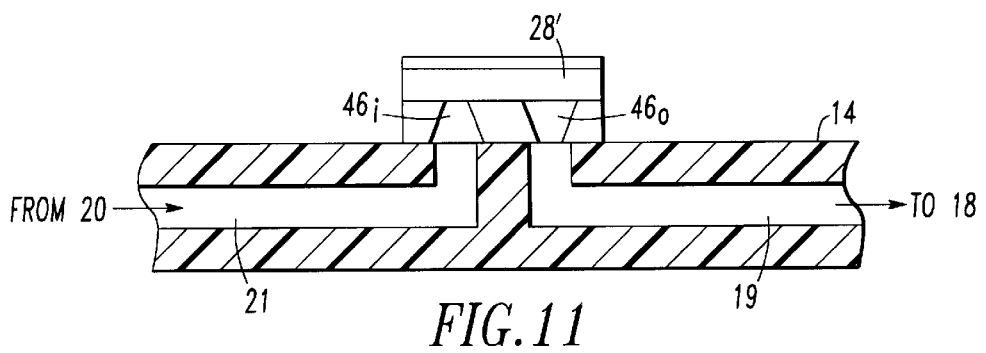
FIG. 11 is a sectional view of the embodiment shown in FIG. 10 taken along the lines 11—11 thereof.

In the embodiment of the invention shown, for example, in FIGS. 10 and 11, a miniature coolant pump 28' including a self-contained pyramidic input valve $46_i$ and output valve $46_o$ are located on the substrate 14. The input valves $46_i$ and output valves $46_o$ are connected to the input and the output manifolds 18 and by conduits 19 and 21.

Figure 12:
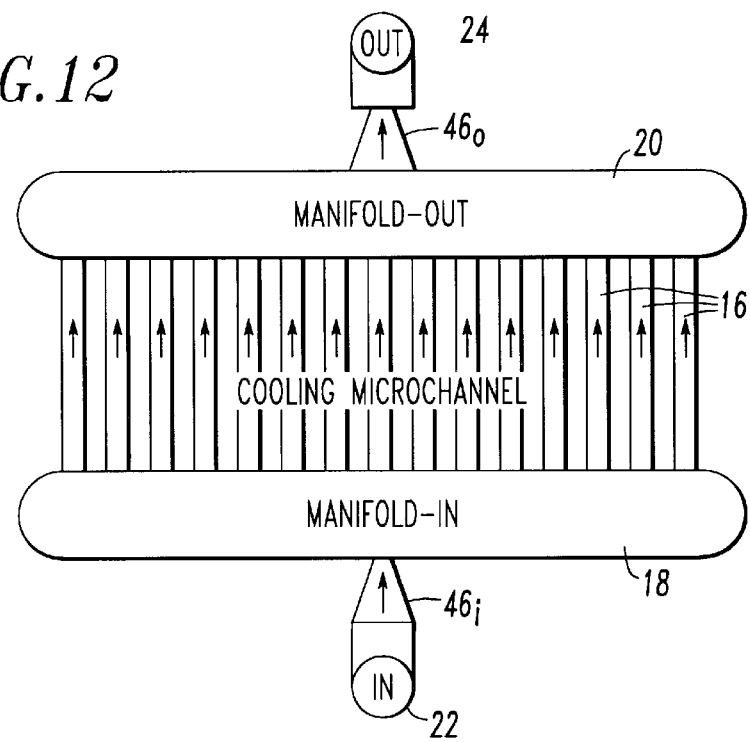
FIG. 12 is a partial mechanical schematic diagram illustrative of an embodiment of a microchannel cooling system utilizing tapered passage microchannel valves shown in FIG. 5 which are part of the coolant manifolds of a microchannel cooled transistor module.

With respect to the second embodiment of the invention shown in FIG. 12, a pyramidic microchannel input valve $46_i$ is located between the input port 22 and the input manifold 18 while a pyramidic microchannel output valve $46_o$ is located between the output manifold 20 and the output port 24.

Figure 13:
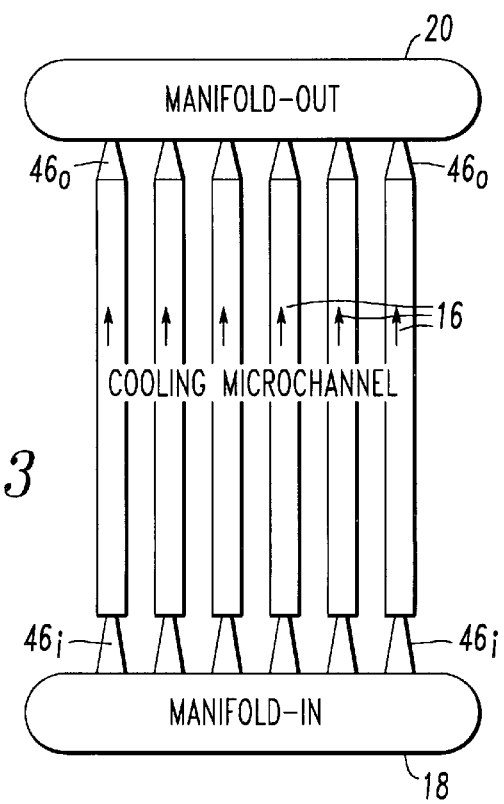
FIG. 13 is a partial mechanical schematic diagram illustrative of an embodiment of tapered passage microchannel valves such as shown in FIG. 5 which are part of a microchannel cooling structure of a microchannel cooled transistor module.

In the embodiment of the invention shown in FIG. 13, respective pyramidic microchannel input and output values $46_i$ and $46_o$ are located between the ends of the microchannels 16 and the manifolds 18 and 20.

When desirable, the tapered passage can be configured in the form of a truncated polyhedron or cone, particularly when they are implemented in silicon.

The tapered passage of the valves 46 has been implemented in silicon having a thickness t ranging from about 0.042 in. to about 0.089 in. and with dimensions D ranging from between about 0.011 in. to 0.039 in. and having included angles a ranging between approximately 55° and 70°.

Thus what has been shown and described is a passive pyramidic microchannel valve which relies on the geometry of the tapered passage to create a greater flow resistance in the negative direction. Such a valve has the advantage of simplicity, easy manufacture and no moving parts, and is compatible with a piezoelectric diaphragm pump capable of operating up to 10 KHz.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

We claim:

1. A microchannel liquid cooling system for dissipating heat generated in a semiconductor module, comprising:
   a semiconductor substrate;
   a plurality of microchannels and a pair of coolant manifolds therefor formed in said substrate below at least one semiconductor device for conducting a coolant therethrough;
   a heat exchanger;
   a coolant circulating pump;
   said pump, said microchannels, and said heat exchanger being connected in a closed loop coolant circulating path; and
   a pair of passive check valves having no moving parts formed in said substrate adjacent said manifolds for controlling the flow of coolant in said coolant circulating path.

2. A cooling system according to claim 1 wherein each of said passive check valves have a tapered passage with an input aperture larger than an output aperture.

3. A cooling system according to claim 2 wherein said tapered passage comprises a truncated polyhedron.

4. A cooling system according to claim 2 wherein said tapered passage comprises a truncated pyramid.

5. A cooling system according to claim 4 wherein said pyramid comprises a four sided pyramid.

6. A cooling system according to claim 2 wherein said tapered passage comprises a truncated cone.

7. A cooling system according to claim 2 wherein said tapered passage defines an interior included angle ranging between approximately 55° and 70°.

8. A cooling system according to claim 2 wherein the distance between the input aperture(D) and the output aperture(d) ranges between about 0.04 in. and about 0.09 in.

9. A cooling system according to claim 2 wherein the input aperture(D) ranges between about 0.01 in. and about 0.04 in.

10. A cooling system according to claim 2 wherein said valves are part of said manifolds.

11. A cooling system according to claim 10 wherein said tapered passage comprises a truncated polyhedron or truncated cone.

12. A cooling system according to claim 1 wherein said tapered passage comprises a truncated pyramid.

13. A cooling system according to claim 2 wherein said valves are part of said microchannels.

14. A cooling system according to claim 13 wherein said tapered passage comprises a truncated polyhedron or cone.

15. A cooling system according to claim 13 wherein said tapered passage comprises a truncated pyramid.

16. A microchannel liquid cooling system for dissipating heat generated in a semiconductor module, comprising:
    a semiconductor substrate;
    a plurality of microchannels and a pair of coolant manifolds therefor formed in said substrate below at least one semiconductor device for conducting a coolant therethrough;
    a heat exchanger;
    a coolant circulating pump;
    said pump, said microchannels, and said heat exchanger being connected in a closed loop coolant circulating path; and
    a pair of passive check valves formed in the substrate and having tapered passages, comprising a truncated polyhedron or truncated cone, said check valves being located immediately adjacent said coolant manifolds for controlling the flow of coolant in said circulating path.

17. A microchannel liquid cooling system according to claim 16 and wherein said tapered passages have interior included angles ranging between about 55° and 70°.

* * * * *